United States Patent [19]

Knauer et al.

[11] 4,163,957
[45] Aug. 7, 1979

[54] TRANSVERSAL FILTER WITH AT LEAST ONE ANALOGUE SHIFT REGISTER, AND PROCESS FOR THE OPERATION THEREOF

[75] Inventors: Karl Knauer, Gauting; Max Schlichte, Munich; Hans-Joerg Pfleiderer, Zorneding, all of Fed. Rep. of Germany

[73] Assignee: Siemens Aktiengesellschaft, Berlin & Munich, Fed. Rep. of Germany

[21] Appl. No.: 832,232

[22] Filed: Sep. 12, 1977

[30] Foreign Application Priority Data

Sep. 28, 1976 [DE] Fed. Rep. of Germany ....... 2643704

[51] Int. Cl.² .................. H03H 7/28; H01L 29/76; H03K 5/156; G11C 19/28
[52] U.S. Cl. .......................... 333/165; 307/221 D; 333/166; 357/24; 364/825; 364/862
[58] Field of Search ................ 333/70 T, 18, 70 R, 333/28 R, 70 A; 307/221 D, 295; 357/24; 328/167; 364/825, 862, 827

[56] References Cited

U.S. PATENT DOCUMENTS

| 4,035,628 | 7/1977 | Lampe et al. ............. 307/221 D X |
| 4,080,581 | 3/1978 | Sakaue et al. ................. 333/70 T |

OTHER PUBLICATIONS

Buss et al.-Transversal Filtering Using Charge Transfer Devices in IEEE Journal of Solid-State Circuits, vol. SC-8, No. 2, Apr. 1973; pp. 138-146.
Puckette et al.-Bucket-Brigade Transversal Filters in IEEE Trans. on Circuits and Systems, vol. CAS-21, No. 4, Jul. 1974; pp. 502-510.

Primary Examiner—Alfred E. Smith
Assistant Examiner—Marvin Nussbaum
Attorney, Agent, or Firm—Hill, Van Santen, Steadman, Chiara & Simpson

[57] ABSTRACT

In illustrated embodiments, at least one analogue shift register has a number of parallel inputs and one series output. A number of individual evaluating circuits receive the signal to be filtered and supply respective output quantities of charge equal to the product of the difference between the relevant signal value and a predetermined minimum or maximum value, and a respective individual evaluation factor. The output of each evaluating circuit can be connected via a switching element to an associated parallel input. The capacity of every storage position of the shift register is at least such that it is always able to accommodate the maximum quantity of charge supplied by the preceding storage position, and when the storage position has a parallel input, can additionally accommodate the maximum quantities of charge supplied by the associated evaluating circuit (s). Various modifications are disclosed for reducing the space requirement of a transversal filter when implemented, for example, as a CCD.

17 Claims, 8 Drawing Figures

TRANSVERSAL FILTER WITH AT LEAST ONE ANALOGUE SHIFT REGISTER, AND PROCESS FOR THE OPERATION THEREOF

BACKGROUND OF THE INVENTION

The present invention relates to a transversal filter with at least one analogue shift register and additionally relates to a process for the operation thereof.

Previously known transversal filters of the type referred to in the introduction are constructed with charge-coupled shift devices (CCDs), and employ either the split electrode principle or the CCD possesses parallel outputs at which the signal can be withdrawn. These known designs are described for example in the publication "Charge Transfer Devices" by Tompsett N.F., Sequien C.H. in Academic Press Inc. New York, San Francisco, London, 1975. In these designs the desired filter function is realized as pulse response, i.e., a short pulse as input signal produces the desired pulse response as output signal at the output end by dividing the individual electrodes of the CCD in the case of the split electrode principle and by evaluating the parallel outputs in the case of the other principle.

With the above described split electrode principle, the output signal is formed from the difference between two high voltages which presents considerable circuitry problems. A further problem consists that under the most unfavorable circumstances, small charge parcels are distributed over large areas. In the process employing parallel outputs, floating gate amplifiers are required which, due to their complicated construction, require for example a multi-layer metallization and consequently entail problems in production and further problems during operation, for example as a result of attenuation due to voltage division.

SUMMARY OF THE INVENTION

Therefore the aim of the present invention is to provide a transversal filter of this kind which is improved in comparison to known transversal filters of the type referred to in the introduction.

The invention realizes the aim in that at least one analogue shift register is provided which possesses a number of parallel inputs and one series output, that a further number of individual, predeterminable evaluating circuits is provided, where each evaluating circuit possesses at least one signal input for the input of the signal to be filtered and at least one output, that at its output each evaluating circuit supplied a quantity of charge which, apart from an individual evaluation factor, is equal to the difference quantity of the relevant signal value of the signal to be filtered minus a predeterminable minimum value which is smaller than or equal to the value of the signal minimum, or apart from the individual factor is equal to the difference quantity of a predeterminable maximum value which is greater than or equal to the value of the signal maximum minus the relevant signal value, that the output of each evaluating circuit can be connected via a switching element to an associated parallel input, and that the capacity of each storage position of the shift register is at least such that it can always accommodate the maximum quantity of charge supplied by the adjacent storage position in the direction opposite to that of the shift process, and when the storage position is one having a parallel input, can additionally accommodate the maximum quantities of charge supplied by the associated evaluating circuit (s).

In a preferred embodiment, each parallel input is assigned only one of the evaluating circuits.

An advantageous embodiment is designed in such manner that the first parallel input and all the following parallel inputs in the direction of shift, up to and including a first predeterminable parallel input are assigned first evaluating circuits, that a second predeterminable parallel input from the latter, and all the following in the direction of shift are assigned second evaluating circuits, and that the signal input of every first evaluating circuit is preceded by a time delay element which delays the input signal by the length of time required for a quantity of charge to pass from the second predeterminable parallel input to the first predeterminable parallel input during the shift process. Preferably, when an odd number of parallel inputs is provided, either the last but one parallel input in the direction of shift constitutes the first predeterminable parallel input and the first parallel input constitutes the second predeterminable parallel input, or else the last parallel input constitutes the first predeterminable parallel input and the second parallel input constitutes the second predeterminable parallel input, and in the case of an even number of parallel inputs, the last parallel input constitutes the first predeterminable parallel input and the first parallel input constitutes the second predeterminable parallel input.

Another advantageous embodiment is designed in such manner that at least one further analogue shift register corresponding to the first is provided, that an additional number of individual, further evaluating circuits corresponding to the first is provided, where the output of every further evaluating circuit can be connected to an associated parallel input of the further shift register, that the signal input of every evaluating circuit and of every further evaluating circuit is preceded by a time delay element and/or a further time delay element is connected following the series output of the shift register and further shift register, where these time delay elements together exhibit a delay time which is equal to the time required by a quantity of charge in the further shift register and in the shift register to pass from the first to the last parallel input, where both shift registers can be operated with the same pulse train.

Preferably a shift register consists of a CCD, wherein, on a surface of a substrate consisting of doped semiconductor material and provided with at least one substrate terminal there is provided at least one row of capacitor elements which each consist of at least one insulating layer capacitor and/or at least one blocking layer capacitor, and which possesses a parallel input in the case of capacitor elements which are intended for one and the same shift pulse train.

Advantageously a shift register is a CCD for four-phase operation which, in addition, in the case of every capacitor element whose next but one adjoining capacitor element has a parallel input, possesses an additional parallel input, wherein every additional parallel input is assigned an additional evaluating circuit, wherein the signal outputs of all the evaluating circuits are connected on the one hand via a first switching element and on the other hand via a second switching element and a delay element to a common signal input, where the delay element exhibits a delay time which is equal to the time required by a quantity of charge to pass from the first capacitor element with one of the parallel inputs to the last capacitor with one of the parallel inputs during the shift process.

Preferably a time delay element consists of a serial shift register. Preferably the latter is a CCD.

Advantageously every evaluating circuit consists of a pair of capacitors which is arranged on a surface of a substrate consisting of doped semiconductor material and provided with at least one substrate terminal, and which consists of at least one first insulating layer—or blocking layer—capacitor which touches a zone which is arranged on the surface of the substrate, is provided with a terminal contact, and is doped oppositely to the substrate, and of at least one second insulating layer—or blocking layer—capacitor which is arranged closely next to the first, where the second insulating layer —or blocking layer—capacitor has a capacitance which is equal to the individual factor, wherein either the outer electrode of the second insulating layer—or blocking layer—capacitor is connected to the signal input and the outer electrode of the first insulating layer—or blocking layer—capacitor is connected to a terminal connected with a fixed voltage whose value is equal to the minimum value, or else the outer electrode of the first insulating layer—or blocking layer—capacitor is connected to the signal input, and the outer electrode of the second insulating layer—or blocking layer—capacitor is connected to a second terminal which is connected to a second fixed voltage whose value is equal to the maximum value, and wherein the counter electrode of the second insulating layer—or blocking layer—capacitor is connected to the output of the evaluating circuit.

Advantageously the transversal filter is integrated on a common substrate composed of doped semiconductor material.

Preferably a switching element consists of a charge transfer element having at least one gate electrode which is connected to a third terminal.

Advantageously every shift register possesses a series input for the input of fundamental charge.

Preferably the first and second switching elements each consist of a field effect transistor.

Each of the described transversal filters is operated in such manner that the analogue shift registers are operated in a manner known per se, that the input of every evaluating circuit is always connected with the input signal either directly or with a time delay, that as a result of the closure of its switching element an evaluating circuit is in each case read into the shift register at least whenever a quantity of charge is displaced from the directly adjacent storage position having a parallel input into the associated storage position having a parallel input, and that the filtered signal is withdrawn from the series output.

An evaluating circuit which consists, in the manner described above, of a pair of capacitors, is operated in such manner that either the terminal of the first insulating layer—or blocking layer—capacitor is connected to the fixed voltage whose value is equal to the minimum value, or else the second terminal of the second insulating layer—or blocking layer—capacitor is connected to the second fixed voltage whose value is equal to the maximum value, and that for the duration of the shift process required by a quantity of charge input into the shift register to reach the adjacent storage position having a parallel input, a voltage is connected which is lower than the voltage connected to the first insulating layer—or blocking layer—capacitor during this period of time, whereas otherwise a voltage is connected which is always greater than the latter.

A transversal filter as described above, provided with a CCD for four-phase operation is additionally operated in such manner that the first switching element is opened during the length of time during which the maximum pulse train voltage difference is connected to a capacitor element having a parallel input, and that the second switching element within the length of time during which the maximum pulse voltage difference is connected to a capacitor element having an additional parallel input.

Particular advantages of a transversal filter in accordance with the invention consist in its simple construction which can be achieved particularly easily in the integrated technique, and in the problem-free, simple mode of operation.

Other objects, features and advantages of the present invention will be apparent from the following detailed description taken in connection with the accompanying sheets of drawings.

DETAILED DESCRIPTION OF THE PREFERRED EMBODIMENTS

Figure 1:
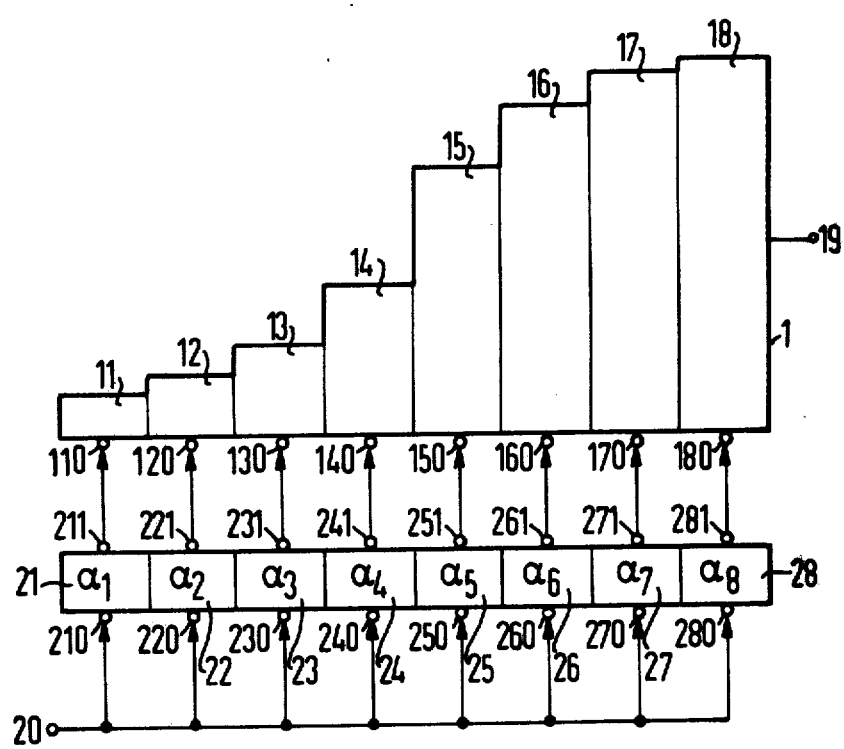
FIG. 1 shows the fundamental construction of a particularly simple embodiment of a transversal filter in accordance with the invention.

In FIG. 1, the analogue shift register is referenced 1. The individual storage positions of this shift register are referenced 11 to 18, the parallel inputs are referenced 110 to 180, and the output of the shift register is referenced 19. The evaluating circuits are provided with the references 21 to 28. Each evaluating circuit possesses an input for the input of the signal which is to be filtered, and possesses an output. These inputs are provided with the references 210 to 280, and these outputs are provided with the references 211 to 281. The individual factors of the evaluating circuits are symbolized by $a_1$ to $a_8$ and are entered into the evaluating circuits. The output of every evaluating circuit is connected via a switching element, which for the sake of simplicity has not been shown here, to an associated parallel input of the shift register. The signal inputs are connected to a common signal input 20. The capacity of every storage position of the shift register must be at least such that it is always able to accommodate the maximum quantity of charge supplied by the adjacent storage position (adjacent in the direction opposite to that of the shift process), and when the storage position is one having a parallel input, can additionally accommodate the maximum quantities of charge supplied by the assigned evaluating circuit (s). In FIG. 1, every storage position possesses one parallel input and every parallel input is assigned only one evaluating circuit.

In FIG. 1, the requisite capacity of every storage position is symbolized by the size of its area. Generally, the requisite capacity of a storage position consists of the sum of all the individual factors of those evaluating circuits which are connected to storage positions by which it is preceded and accompanied times the difference quantity of the maximum value minus the minimum value. If the shift register is operated with a fundamental charge, the capacity of every storage position must be extended by this fundamental charge.

In the operation of the transversal filter illustrated in FIG. 1, the shift register is operated in the conventional manner and the signal which is to be filtered is connected to the common signal input 20. As a result of the simultaneous opening of all the switching elements, the quantities of charge which are supplied by the evaluating circuits and which correspond to the instantaneous signal value, are read into the shift register in parallel fashion. Following the displacement of these quantities of charge by one storage position towards the series output, the read-in process is recommenced etc.

If the signal which is to be filtered is a pulse of short duration whose duration is shorter than the time required for the shift process from one storage position to the next, at the series output 19 a pulse sequence is obtained in which when there are as many adjacent pulses as parallel inputs are provided, the pulse amplitudes differ from an equal value. In a time sequence, the quantity of the deviation corresponds to the individual factors $a_8$ to $a_1$, i.e., the first pulse in the time sequence having a deviating amplitude differs by $a_8$, the next by $a_7$ etc. from the equal value. The decision whether this quantity is added or deducted from the equal value is dependent upon the nature of the associated evaluating circuit. If the associated evaluating circuit supplied a quantity of charge which, apart from the individual evaluation factor, is equal to the difference between the relevant signal value of the signal to be filtered minus the minimum value, the quantity is added, and otherwise it is deducted. Accordingly, using a transversal filter as illustrated in FIG. 1, a predetermined pulse response can be realized in a very simple fashion as follows: the pulse response is represented as a series of time coefficients. Each coefficient indicates the amplitude of the pulse response at a specific support point. The coefficients are assigned an equal number of adjacent storage positions having a parallel input in the shift register. Each parallel input is assigned an evaluating circuit, in each of which one of the coefficients is selected as the individual evaluation factor. The evaluating circuits are assigned consecutively to the parallel inputs in accordance with the time sequence of the coefficents, in the direction opposite to that of the shift process. In the case of positive coefficients, evaluating circuits are employed which at their output supply a quantity of charge which, apart from the coefficients, is equal to the difference in the relevant signal value of the signal to be filtered minus the minimum value, and in the case of negative coefficient the other type of evaluating circuit is used.

Figure 2:
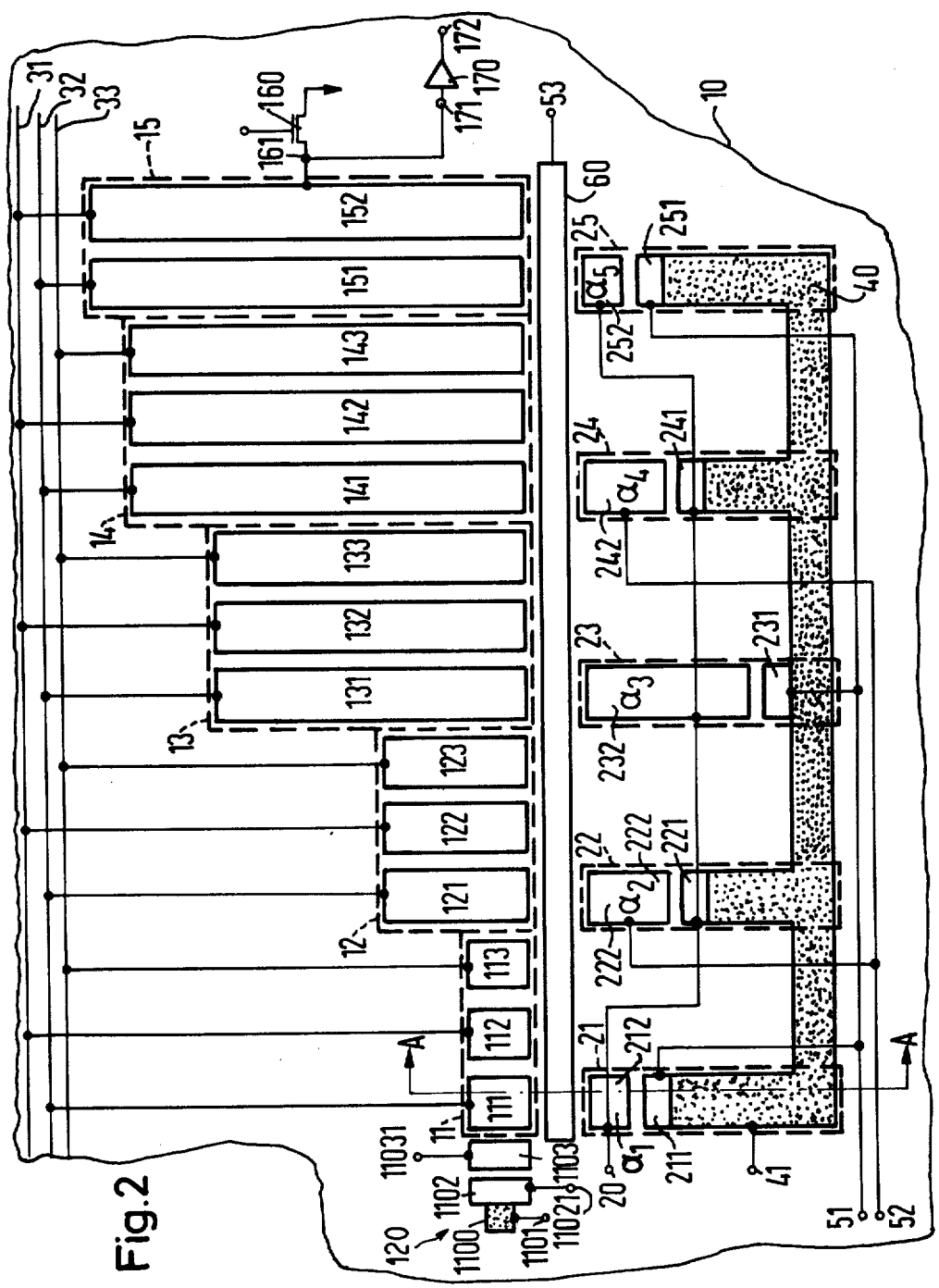
FIG. 2 shows a realization of a transversal filter as shown in FIG. 1, in which the shift register is designed as a CCD for three-phase operation, and the evaluating circuits comprise pairs of capacitors.

FIG. 2 illustrates a realization of a transversal filter corresponding to FIG. 1. Here, in contrast to FIG. 1, only the first five storage positions having a parallel input and the first five evaluating circuits are provided. All the references in this part of FIG. 1 are used for the corresponding devices in FIG. 2. In FIG. 2, on a surface of a substrate 10 composed of doped semiconductor material of one conductivity type, the shift register is constructed as a CCD for three-phase operation and the evaluating circuits are constructed as pairs of capacitors. The CCD consits of a series of insulating layer—or blocking layer—capacitors 111 to 152, which are arranged on the surface of the substrate. The distance between the outer electrodes of adjacent capacitors must be selected to be sufficiently small ($<3 \mu m$) that a charge transfer can take place. Each of the storage positions 11 to 14 consists of three of these capacitors arranged next to one another. The storage position 15 here consists of only two capacitors. Beside the capacitor 111 there is arranged a coventional input stage, and beside the capacitor 152 there is arranged a conventional output stage which comprises a field effect transistor 160 as reset transistor and of an amplifier 170, whose input 170 is connected to the source electrode 161 of the transistor 160 and at whose output 172 the filtered signal can be obtained. The input stage serves merely for the input of fundamental charge into the CCD. It consists of a zone 1100 which is doped oppositely to the substrate and which is provided with a terminal contact 1101, and of two insulating layer—or blocking layer—capacitors 1102 and 1103 which are arranged next to one another, where the insulating layer—or blocking layer—capacitor 1102 is arranged directly next to the doped zone 1100 and the other is arranged directly next to the capacitor 111. The gate electrode of each of these capacitors is provided with a terminal contact 11021 and 11031. The operation is carried out in accordance with the fill and spill method, i.e., two different voltages are connected to the gate electrodes of the capacitors 1102 and 1103, so that beneath the gate electrode of the capacitor 1103 there exists a potential well of the surface potential in comparison to that of the other. By briefly connecting a suitable voltage to the doped zone above its terminal contact, both capacitors are overflooded with charge carriers (in the present case with electrons). Accordingly a blocking voltage is connected to the doped zone, as a result of which all the charge carriers except for those in the potential well beneath the gate electrode of the capacitor 1103, flow back into the doped zone. The determinate quantity of charge held in the potential well is input, as fundamental charge, into the CCD when the maximum pulse train voltage difference exists across the capacitor 111. The outer capacitor electrodes of all the capacitors 111 to 152 are connected to three pulse train lines 31 to 33 in accordance with the three-phase operation. The capacitors arranged at the same point in every storage position are connected to the same pulse train line.

The evaluating circuits 21 to 25 are arranged beside (adjacent) capacitors which are connected to the same pulse train line—in the present case the pulse train line 32. Each evaluating circuit consists of a pair of capacitors which is arranged on the surface of the substrate and is composed of a first insulating layer—or blocking layer—capacitor 211 to 251, which has a contact in the form of a zone 40 which zone 40 is arranged on the surface of the substrate, is provided with a terminal contact 41, and is doped oppositely to the substrate (this is to signify that the lateral spacing of the outer capacitor electrode is <3 μm), and is composed of a second insulating layer—or blocking layer—capacitor 212 to 252 which is arranged closely (<3 μm) beside the first. The second insulating layer—or blocking layer—capacitor in each case possesses a capacitance which is equal to the individual factor. In FIG. 2 the individual factor is symbolized by the area content of the second capacitors 212 to 252. The following special selection has been made: $\alpha_2 = 2\alpha_1$, $\alpha_3 = 2\alpha_2$, $\alpha_4 = \frac{1}{2}\alpha_3$ and $\alpha_5 = \frac{1}{2}\alpha_4$. Accordingly in the CCD, the requisite capacity of each capacitor is symbolized by its area content. The evaluating circuits 21, 23 and 25 are especially for positive coeffecients, and the evaluating circuits 22 and 24 are especially for negative coefficients. Accordingly the outer capacitor electrodes of the capacitors 212, 221, 232, 241 and 252 are connected to the common signal input 20, the outer electrodes of the capacitors 211, 231 and 251 are connected to a terminal 51 to which a fixed voltage is connected, whose value is equal to the minimum value of the signal to the filtered, and the outer electrodes of the capacitors 222 and 242 are connected to a second terminal 52 for the connection of a second fixed voltage whose value is equal to the maximum value of the signal to be filtered. The output of each evaluating circuit is located in the second insulating layer—or blocking layer—capacitors. The counter electrode, i.e. the zone beneath the outer capacitor electrode of these second capacitors is connected via a CCD to the counter electrode of the associated capacitor of the CCD. All the charge transfer elements consist of a gate electrode 60 which is common to all the evaluating circuits and which is connected to a third terminal 53, and which is separated from the substrate surface by an electrically insulating layer. The lateral distance of the gate electrode to the corresponding capacitors of the CCD and the evaluating circuit must be sufficiently narrow (<3 μm). In order to prevent a charge flow beneath the gate electrode in its longitudinal direction, it is expedient to arrange said gate electrode between the evaluating circuits on a thicker insulating layer. The charge transfer elements can also consist of field effect transistors.

Figure 3:
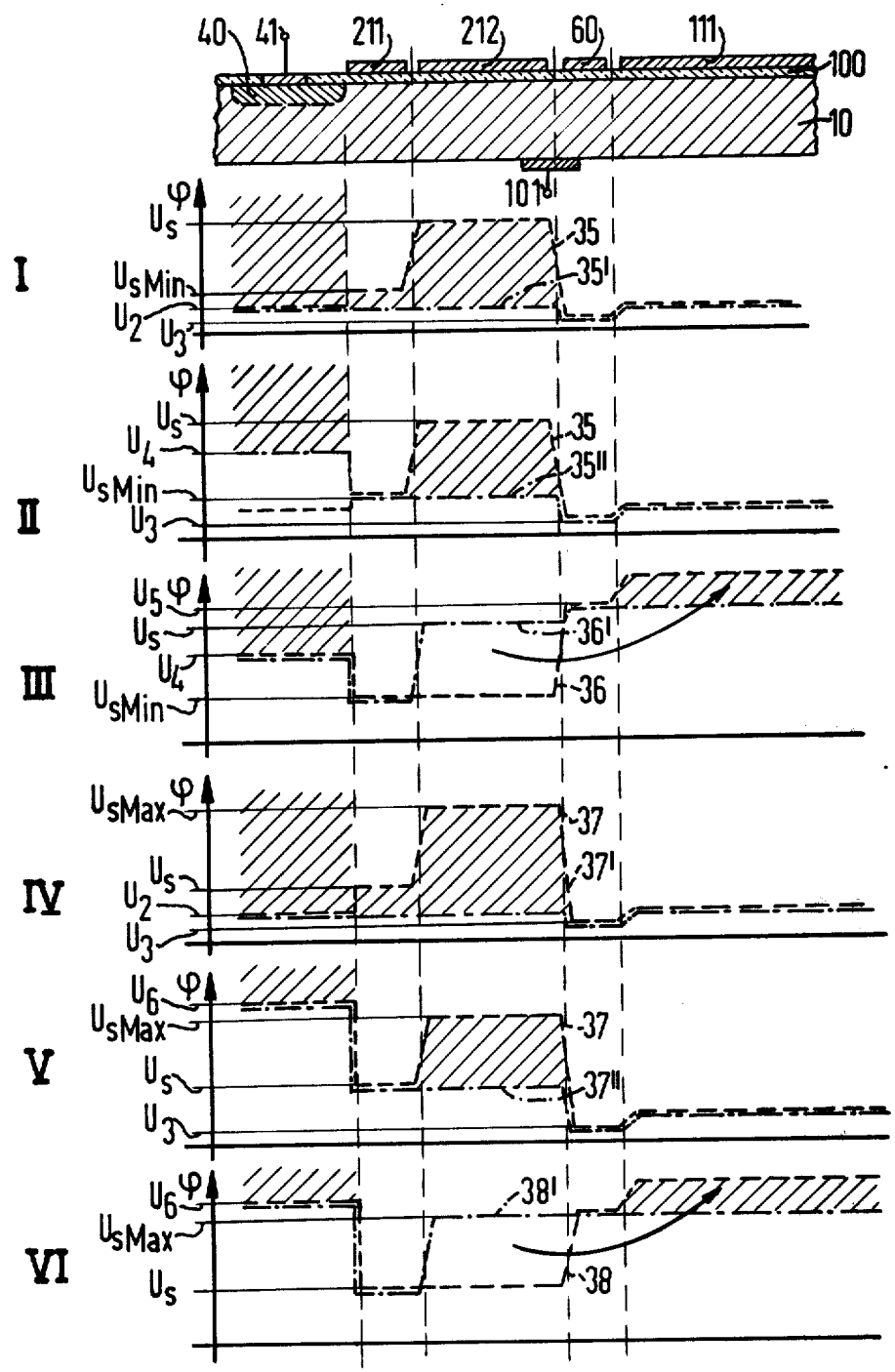
FIG. 3 is a cross-section through the realization shown in FIG. 2 along the sectional line A—A, and beneath in diagrams I to VI, shows local potential curves of the surface potential in the substrate for various modes of operation and operating states.

Making reference to FIG. 3. the mode of operation of an evaluating circuit as shown in FIG. 2, which is likewise carried out in accordance with the fill and spill method, will be explained in detail. Here FIG. 3 is a cross-section through the transversal filter shown in FIG. 2, along the sectional line A—A. Beneath this cross-section, diagrams I to VI illustrate local potential curves of the surface potential $\Phi$ in the substrate for various modes of operation and operating states. The cross-section illustrates the substrate 10, for example p-doped silicon, with the substrate terminal 101. On the surface of the substrate is arranged an electrically insulating layer 100, consisting for example of silicon dioxide, on which are arranged the outer electrodes of the insulating layer capacitors 111, 212 and 211 and the gate electrode 60. The outer electrodes of the capcitors are provided with the same references as in FIG. 2. Beside (adjacent) the electrode 211, directly beneath the substrate surface is arranged the oppositely doped zone 40. The switching element 21 (capacitor 212) which is shown in cross-section is assigned a positive coefficient ($\alpha_1 > 0$). The relevant mode of operation will be explained in detail making reference to diagrams I to III. The electrode 211 is always connected with the minimum value $U_{MIN}$, whereas the electrode 212 is always connected to the instantaneous signal value. When a quantity of charge has been input into the CCD, it is cut off by the connection of a voltage $U_3$ which is smaller than $U_{MIN}$. Then the terminal 41 is connected to a voltage $U_2$ which lies between $U_{MIN}$ and $U_3$. As a result the surface zones of the substrate beneath the electrodes 211 and 212 become overflooded with electrons. Diagram I schematically illustrates these conditions. The broken-line curve 35 shows the local course of the surface potential in the substrate prior to the overflooding, and the dash-dotted curve 35' shows that following the overflooding, in schematic form. The shaded zone indicates the area which is overflooded with electrons. $U_S$ indicates the instantaneous signal value. In actual fact, in first approximation the start voltage by which the surface potential is reduced would have to be deducted from $U_{MIN}$, $U_S$ and $U_3$, but here and in the following this has been omitted for the sake of simplicity. Following the overflooding, at the terminal 41 the voltage is increased beyond $U_{MIN}$ to a value $U_4$. Diagram II represents the conditions (curve 35'') for this situation. As can be seen, apart from the zone 40 electrons are stored only beneath the electrode 212. The stored quantity of charge is equal to the product of the capacitance of this insulating layer capacitor times the difference $U_S - U_{MIN}$. Subsequently the voltage across the gate electrode is increased beyond $U_S$ to $U_5$, which is advantageously selected to be greater than the signal maximum. If the maximum pulse train voltage which is selected to be greater than or equal to $U_5$ now appears across the capacitor electrode of the capacitor 111, the quantity of charge stored beneath the electrode 212 is read out and the process recommences. Diagram III represents the associated potential conditions by the curves 36 and 36', where the broken-line curve 36 represents the conditions at the beginning of the read-out process, and the dash-dotted curve 36' represents the conditions at the end of the read-out process.

It will now be assumed that the evaluating circuit 21 is assigned a negative coefficient, as is actually the case in the evaluating circuits 22 and 24. In this situation the signal $U_S$ is constantly connected to the electrode 211, and the maximum value of $U_{MAX}$ is constantly connected to the electrode 212. As previously, following the read-in of the quantity of charge into the CCD, the switching element is opened in that the gate electrode is connected to a voltage which is smaller than the signal value $U_S$. Expediently this voltage $U_3$. Then the input 41 is connected to a voltage which is smaller than $U_S$. Expediently it is also selected to be equal to the voltage $U_2$. As in the preceding case, the zones beneath the electrodes 211 and 212 are overflooded with electrons. Diagram IV represents these conditions. The broken-line curve 37 indicates the curve of the surface potential in the substrate prior to the overflooding, the dash-dotted curve 37' indicates that following the overflooding, and the shaded zone is the component overflooded with electrons. Then the voltage across the terminal 41 is increased beyond the signal value $U_S$, and expediently even beyond $U_{MAX}$, so that a voltage $U_6$ is connected thereto. Beneath the electrode 212 there is now stored a quantity of charge which is equal to the capacitance of the capacitor 212 times the difference $U_{MAX} - U_S$. Diagram V illustrates these conditions (curve 37''). Then the voltage across the gate electrode is increased to $U_{MAX}$ or above, and the electrons stored beneath the electrode 212 can discharge into the capacitor 111 when the maximum pulse train voltage is connected thereto. The broken-line curve 38 and the dash-dotted curve 38' in the diagram VI represent the course of the surface potential prior to and following the end of the read-out process respectively.

The above described operating process has been based on a p-doped substrate, i.e., all the voltages are positive relative to the substrate potential. In the case of a n-doped substrate it is merely necessary to reverse the polarity of all the voltages, in which case the value $U_{MAX}$ will now correspond to the maximum negative value, and $U_{MIN}$ will now correspond to the smallest negative value.

Relative to the substrate potential, only positive signal values will now expediently be used in the case of a p-doped substrate, and only negative signal values in the case of a n-doped substrate.

Figure 4:
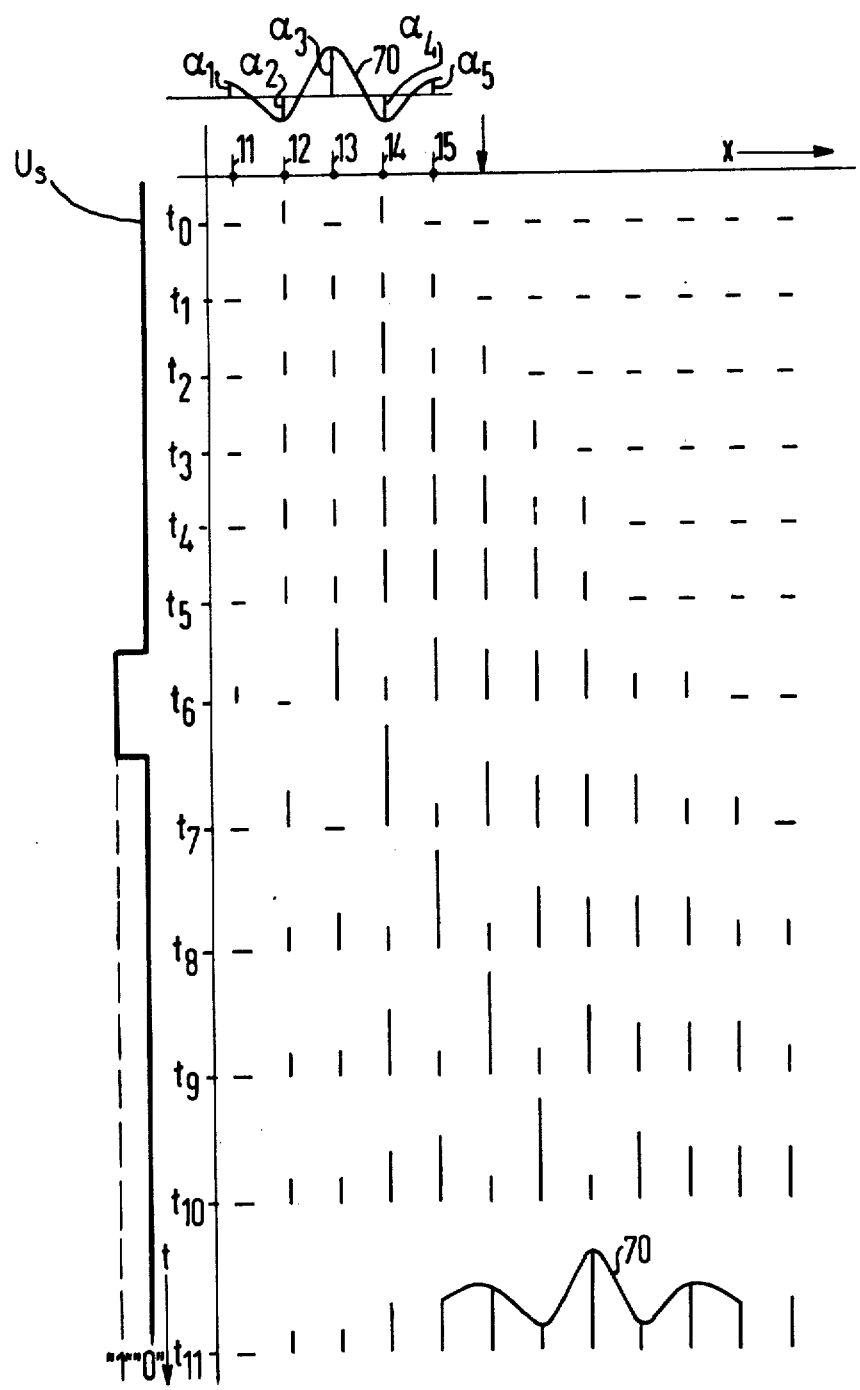
FIG. 4 illustrates how the filtered signal is formed in a device as shown in FIG. 2.

In the form of a time diagram, FIG. 4 now shows how the charge parcels input in the individual evaluating circuits are added, to form the desired, filtered signal. A pulse of short duration is used as input signal. The curve 70 approximated by the coefficients $a_1$ to $a_5$ has been provided as the desired pulse response. In accordance with the description of FIG. 2, here in particular $a_2 = -2a_1$, $a_3 = 4a_1$, $a_4 = -2a_1$ and $a_5 = a_1$. The associated parallel inputs and storage positions are marked beneath by points on the abscissa. The output of the shift register is marked by an arrow on the abscissa. The times $t_0$ to $t_{11}$ on the downwards directed ordinate mark consecutive read-in processes. The signal ($U_S$) which is to be filtered is represented in parallel with the ordinate. In the diagram a transverse line indicates that no quantity of charge is present or has been read-in. Read-in occurs for the first time at the time $t_0$. As the signal value is "0", and thus corresponds to the minimum value, no quantity of charge is read-into the storage positions 11, 13 and 15, whereas the maximum quantity of charge which can be produced is read-into the storage positions 12 and 14. This maximum quantity of charge corresponds to the value $2a_1$. When this charge distribution has been displaced by one storage position, at the time $t_1$ the original charge distribution corresponding to the time $t_0$ is again read-in and added. This continues successively until the read-in occurring at the time $t_5$. Following this read-in process, the evaluating circuits are connected to the maximum value, so that no quantity of charge is present in the storage positions 12 and 14, whereas the quantity of charge $a_1$ is present in the storage positions 11 and 15 and the quantity of charge $4a_1$ is present in the storage position 13. At the time $t_6$ this charge distribution is added to the charge distribution at the time $t_5$ displaced by one storage position. Following the read-in at the time $t_6$ the signal value is again "0", so that in the following the original charge distribution corresponding to the time $t_0$ is again read-in and added. At the time $t_{11}$ the complete filter function is achieved as characterized by the curve 70.

In the embodiment illustrated in FIG. 2, the CCD is a conventional CCD for three-phase operation. In the case of a silicon substrate, when insulating layer capacitors are used, the electrically insulating layer preferably consists of silicon dioxide, and the outer electrodes preferably consist of aluminum. However all possible types of CCD are suitable for this embodiment, for example CCDs for two-phase operation or four-phase operation in an aluminum-silicon-, silicon-silicon-, or aluminum-aluminum- technique, or CCDs for three-phase operation in one of the aforementioned techniques. As in a CCD, every storage position possesses as many capacitor elements as pulse train lines are provided, it is possible for a CCD of this kind to realize as many different filter functions as pulse train lines are provided. Parallel inputs and evaluating circuits must be provided besides the capacitor elements of each pulse train line. The read-in of the coefficients of the desired filter function is effected by opening the gate electrode during the corresponding pulse train pulse.

Figure 5:
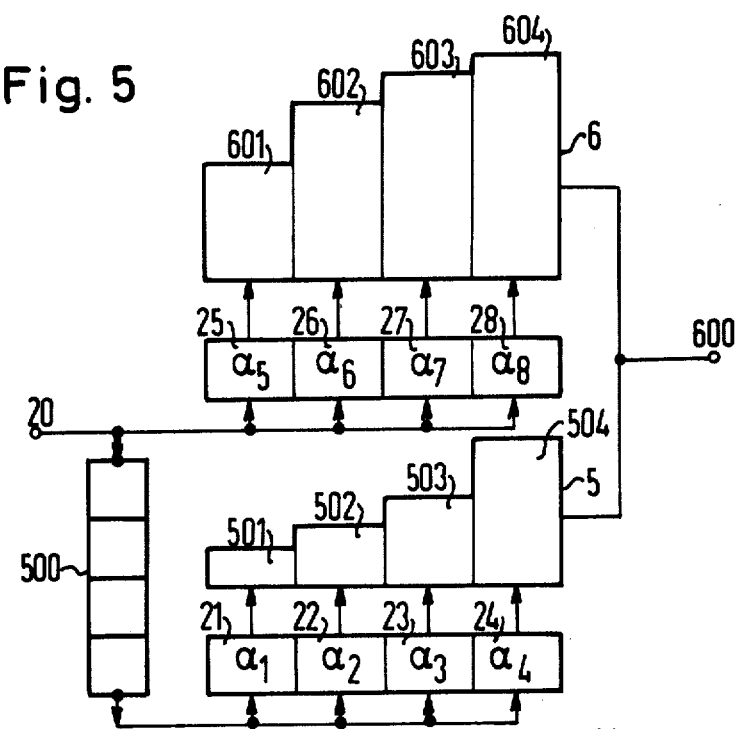
FIGS. 5 and 6 schematically illustrate the construction of a transversal filter having two shift registers.
Figure 6:
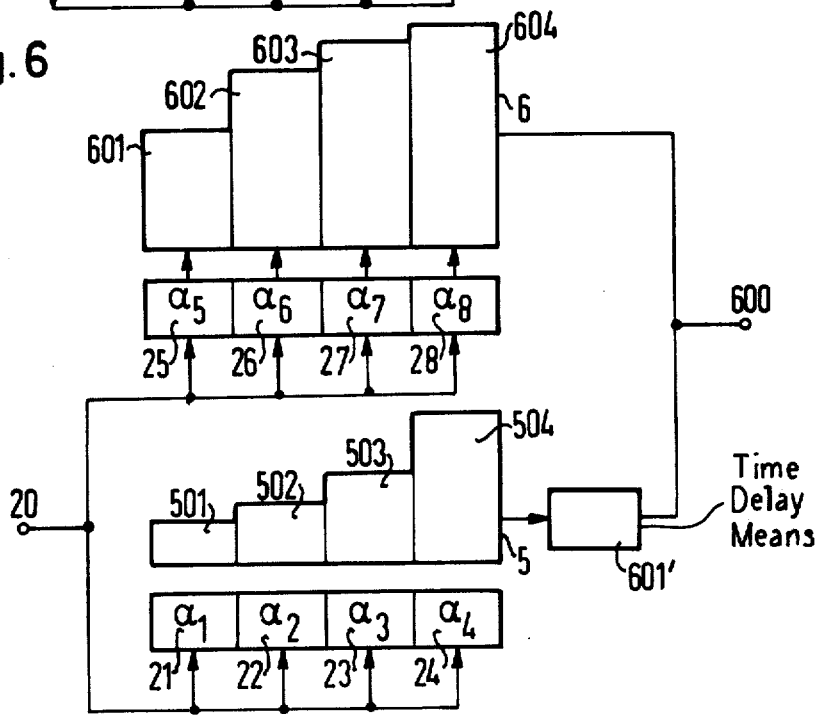

The space requirement of a transversal filter as illustrated in FIG. 1 or FIG. 2 can be considerably reduced by means of a few measures. A first measure consists in dividing up the CCD. FIGS. 5 and 6 schematically illustrate the construction of two transversal filters in accordance with this measure. Here the transversal filter illustrated in FIG. 1 has been used as a comparative filter. FIG. 5 shows a first analogue shift register 5 for the first individual factors $a_1$ to $a_4$ and a further analogue shift register 6 for the remaining individual factors $a_5$ to $a_8$. The storage positions of the first shift register 5 are referenced 501 to 504, and those of the second are referenced 601 to 604. The evaluating circuits are referenced as in FIG. 1. The series outputs of both shift registers are connected to form a common output 600. The evaluating circuits 25 to 28 which belong to the further shift register are connected directly to the common input 20, whereas the evaluating circuits 21 to 24 belonging to the first shift register are connected via a time delay element 500. The time delay element delays the input signal by the length of time required by a quantity of charge in the further shift register to pass from the storage position 601 to the storage position 604. Preferably the time delay element consists of an analogue series shift register having an equal number of storage positions as the further shift register. Here the first and further shift registers can consist of a CCD. The operation of this embodiment is identical to that of the transversal filter shown in FIG. 1. It should be merely ensured that all the shift registers are operated with the same shift pulse trains. This embodiment allows a reduction of approximately one third of the area space required in FIG. 1.

FIG. 6 shows a variant of the embodiment illustrated in FIG. 5. It differs from the latter merely in that all the evaluating circuits 21 to 28 are directly connected to the common input 20, but that a time delay element 601' which has the same properties as the time delay element 500 is connected between the common series output 600 and the output of the first shift register 5.

In the embodiments shown in FIG. 5 and FIG. 6, the shift registers do not require to possess an equal number of storage positions and evaluating circuits.

Figure 7:
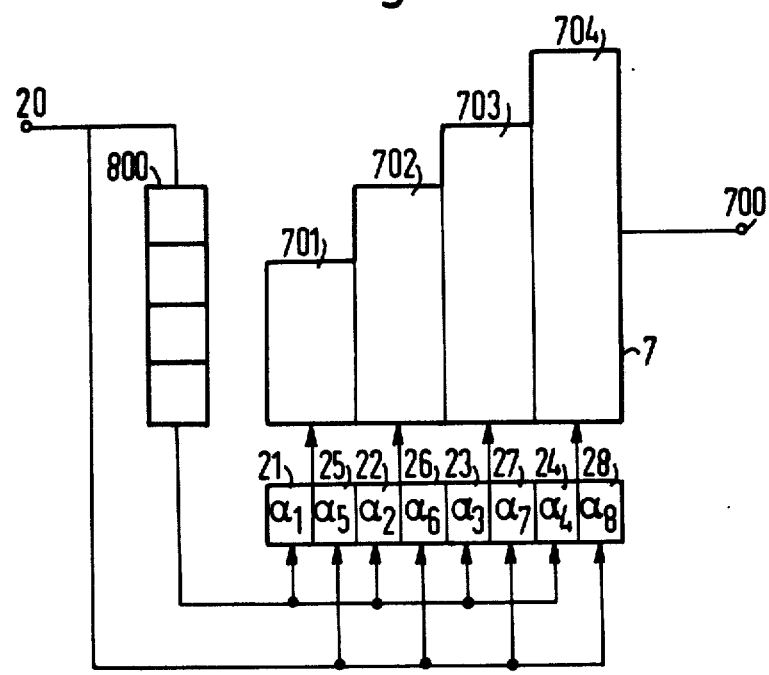
FIG. 7 shows a transversal filter in which every parallel input of the shift register is assigned two evaluating circuits.

Another advantageous measure whereby the area requirement can be reduced consists in assigning to a storage position in the shift register not simply one evaluating circuit. FIG. 7 illustrates a corresponding exemplary embodiment. Here again the transversal filter shown in FIG. 1 serves as comparative filter. In FIG. 7 the shift register 7 possess four storage positions 701 to 704. The series output is referenced 700. Each storage position is assigned two evaluating circuits, and in fact consecutively in the direction of shift, the pairs of evaluating circuits 21 and 25, 22 and 26, 23 and 27, and 24 and 28. The second half of the evaluating circuits 25 to 28 in FIG. 1 are directly connected to the signal input 20, whereas the first half of the evaluating circuits 21 to 24 are connected therewith via a time delay element 800. This time delay element possesses a delay time which is equal to the time required by a quantity of charge to pass from the first storage position 701 to the last storage position 704 in the CCD 7. This shift register must then possess as many storage positions as the shift register 7 and must be operated with the same shift pulse trains. The mode of operation of this embodiment is identical to that in FIG. 1. In contrast, however, the charge quantities of two evaluating circuits are read-into every storage position. The requisite capacity of every storage position is symbolized by its area content as in FIG. 1 and FIGS. 5 and 6. Here again it is possible to reduce the area requirement by more than one third in comparison to the embodiment in FIG. 1.

Generally speaking a transversal filter as illustrated in FIG. 7 is constructed in such manner that the first parallel input and all the following parallel inputs in the direction of shift, up to and including a first, predeterminable parallel input, are each assigned a first evaluating circuit, that a second, predeterminable parallel input from the latter and all the following in the direction of shift are each assigned a second evaluating circuit, and that the signal input of every first evaluating circuit is preceded by a time delay element which delays the input signal by the length of time required by a quantity of charge to pass from the second predeterminable parallel input to the first predeterminable parallel input during the shift process. In the case of an odd number of parallel inputs, either the last but one parallel input in the direction of shift is selected as the first predeterminable input, and the first parallel input is selected as the second predeterminable parallel input, or else the last parallel input is selected as the first predeterminable parallel input and the second parallel input is selected as the second predeterminable parallel input. In the case of an even number of parallel inputs, as is the case in FIG. 7, the last parallel input is selected as the first predeterminable parallel input, and the first parallel input is selected as the second predeterminable parallel input.

Another possibility of reducing the area requirement consists in selecting a shift register which is a CCD for four-phase operation in the case of every element whose next but neighbor is a capacitor element having a parallel input, possesses an additional parallel input, where every additional parallel input is assigned an additional evaluating circuit, wherein the signal outputs of all the evaluating circuits are connected on the one hand via a first switching element and on the other hand via a second switching element and a delay element to a common signal input, where the delay element possesses a delay time which is equal to the time required by a quantity of charge to pass through the CCDs 8.

Figure 8:
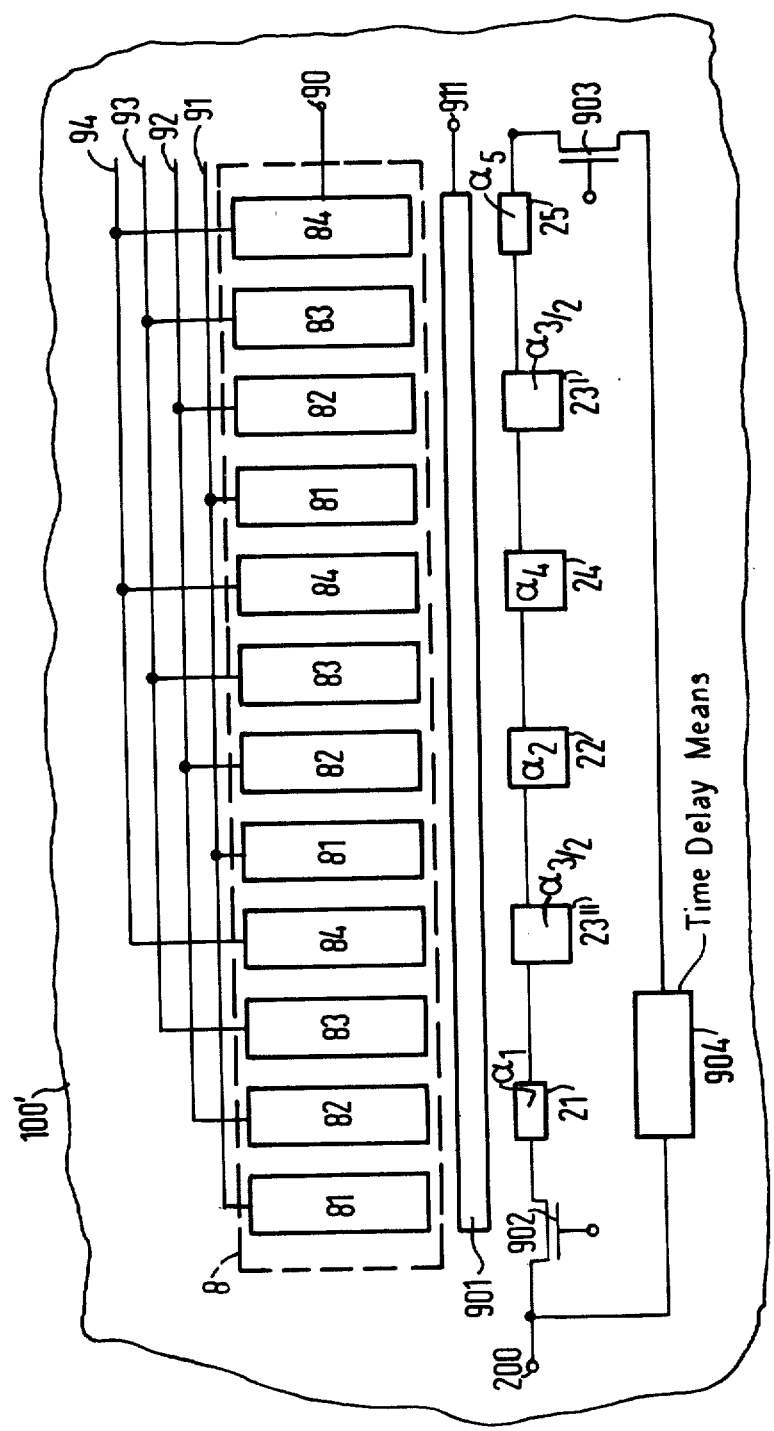
FIG. 8 illustrates a realization of a transversal filter with a CCD for four-phase operation.

FIG. 8 illustrates an associated exemplary embodiment. Here the CCD 8 consists of consecutive four-member groups of capacitor elements referenced 81 to 84. Each four-member group forms one storage position. The outer electrodes of each capacitor element in every four-member group are connected consecutively to four pulse train lines 91 to 94. The direction of shift again possesses a series output 90 at one end. In FIG. 8 the direction of shift leads in the right-hand direction. The evaluating circuits and additional evaluating circuits are based on the evaluating circuits 21 to 25 in FIG. 1 and FIG. 2. However as an odd number of evaluating circuits is now always contrasted with an even number of parallel inputs, one parallel input remains unused. However, this parallel input can be employed if one evaluating circuit is divided in two. It is expedient to carry out this division in the case of an evaluating circuit having a high individual evaluation factor, thus having a large area requirement. In FIG. 2 the evaluating circuit 23 will be suitable. Thus one has a series of three evaluating circuits 21 to 23' and three additional evaluating circuits 23" to 25. The evaluating circuit 23' and the evaluating circuit 23" are expediently each assigned the individual evaluation factor $a_{3/2}$. The evaluating circuits 21 to 23' are arranged beside the capacitor elements 82 and the others beside the capacitor elements 84. The construction of the evaluating circuits corresponds to that in FIG. 2 and, as in FIG. 2, between the CCD and the evaluating circuits there is arranged a gate electrode which here is referenced 901 and fulfills the same function as in the embodiment illustrated in FIG. 2. Likewise, the entire arrangement is arranged on a surface (of a substrate composed of doped semiconductor material and having a substrate terminal) which is referenced 100'. The inputs of all the evaluating circuits are connected via a field effect transistor 902, as first switching element, to a common signal input 200. In addition they are connected via a further field effect transistor 903, as second switching element, and the time delay element 904 to the the signal input 200. The time delay element can again consist of a shift register, in the present case a CCD. The embodiment illustrated in FIG. 8 is operated in the same way as that in FIG. 2, i.e., read-in takes place whenever a quantity of charge has been displaced from a capacitor element having a parallel input to the directly adjacent capacitor element having a parallel input, i.e., in this case from one parallel input to an additional parallel input or vice versa. The switching element 902 is closed whenever the maximum pulse train voltage is connected to the pulse train line 94, and the switching element 903 is closed whenever the maximum pulse train voltage is connected to the pulse train line 92.

It will be apparent that many modifications and variations may be effected without departing from the scope of the novel teachings and concepts of the present invention.

We claim as our invention:

1. A transversal filter comprising analogue shift register means having successive storage positions, said shift register means having a number of parallel inputs and comprising input charge receiving storage positions having the respective parallel inputs assigned thereto, and said shift register means having a common output, a further number of individual predeterminable evaluating circuit means each having at least one signal input for the input of the signal which is to be filtered, and at least one output, each evaluating circuit means being arranged to weight the input signal thereto in accordance with an individual evaluation factor for producing at its output a weighted charge for supply to an associated input charge receiving storage position, switching element means controlling coupling of the outputs of the evaluating circuit means with the respective assigned parallel inputs for supplying the weighted charges to respective input charge receiving storage positions via the respective assigned parallel inputs, each storage position of the shift register being at least such that it is always able to accommodate the maximum quantity of charge supplied by a preceding storage position, and each input charge receiving storage position being such that it is always able to accommodate the maximum quantity of charge supplied by a preceding storage position and additionally able to accommodate the maximum quantity of charge supplied via its assigned parallel input, and said filter being further characterized in that the evaluating circuit means comprises first evaluating circuits (21-24, FIG. 7) having first signal inputs thereto, and comprises second evaluating circuits (25–28, FIG. 7) having respective second signal inputs for receiving an input signal to be filtered, and in that the first signal input of every first evaluating circuit is preceded by a time delay element (800) which delays the input signal thereto relative to the input signal received by said second signal inputs by the length of time required for a quantity of charge to pass through the shift register means during the shift process.

2. A transversal filter as claimed in claim 1, characterized in that in the event of an odd number of parallel inputs either the last-but-one parallel input in the direction of shift constitutes a first predeterminable parallel input, and a first-occurring parallel input constitutes a second predeterminable parallel input, or else the last-occurring parallel input constitutes a first predeterminable parallel input and a second-occurring parallel input constitutes a second predeterminable parallel input, and that in the event of an even number of parallel inputs, a second-occurring parallel input constitutes a first predeterminable parallel input and a first-occurring parallel input constitutes a second predeterminable parallel input.

3. A transversal filter as claimed in claim 1, characterized in that said time delay element consists of a serial shift register.

4. A transversal filter as claimed in claim 3, characterized in that the serial shift register is a charge coupled device.

5. A transversal filter comprising analogue shift register means having successive storage positions, said shift register means having a number of parallel inputs and comprising input charge receiving storage positions having the respective parallel inputs assigned thereto, and said shift register means having a common output, a further number of individual predeterminable evaluating circuit means each having at least one signal input for the input of the signal which is to be filtered, and at least one output, each evaluating circuit means being arranged to weight the input signal thereto in accordance with an individual evaluation factor for producing at its output a weighted charge for supply to an associated input charge receiving storage position, switching element means controlling coupling of the outputs of the evaluating circuit means with the respective assigned parallel inputs for supplying the weighted charges to respective input charge receiving storage positions via the respective assigned parallel inputs, each storage position of the shift register being at least such that it is always able to accommodate the maximum quantity of charge supplied by a preceding storage position, and each input charge receiving storage position being such that it is always able to accommodate the maximum quantity of charge supplied by a preceding storage position and additionally able to accommodate the maximum quantity of charge supplied via its assigned parallel input, said filter being further characterized in that said shift register means comprises a first shift register (5) having first parallel inputs, and a second shift register (6) having second parallel inputs, said evaluating circuit means having first signal inputs for supply of weighted charge to the first parallel inputs of the first shift register and having second signal inputs for receiving an input signal to be filtered and for supply of weighted charge to the second parallel inputs of the second shift register, the first signal inputs of the evaluating circuit means being preceded by a time delay element (500) for delay of the signal to be filtered as supplied to the first shift register (5) in comparison to the signal to be filtered as supplied to said second shift register (6).

6. A transversal filter comprising analogue shift register means having successive storage positions, said shift register means having a number of parallel inputs and comprising input charge receiving storage positions having the respective parallel inputs assigned thereto, and said shift register means having a common output, a further number of individual predeterminable evaluating circuit means each having at least one signal input for the input of the signal which is to be filtered, and at least one output, each evaluating circuit means being arranged to weight the input signal thereto in accordance with an individual evaluation factor for producing at its output a weighted charge for supply to an associated input charge receiving storage position, switching element means controlling coupling of the outputs of the evaluating circuit means with the respective assigned parallel inputs for supplying the weighted charges to respective input charge receiving storage positions via the respective assigned parallel inputs, each storage position of the shift register being at least such that it is always able to accommodate the maximum quantity of charge supplied by a preceding storage position, and each input charge receiving storage position being such that it is always able to accommodate the maximum quantity of charge supplied by a preceding storage position and additionally able to accommodate the maximum quantity of charge supplied via its assigned parallel input, said filter being further characterized in said shift register means comprising a first shift register (5, FIG. 6) having first parallel inputs and a first series output, and a second shift register (6, FIG. 6) having second parallel inputs and a second series output connected to said common output, said first series output of said first shift register (5) being followed by a time delay means (601'), such time delay means providing a total delay time which is equal to the time required by a quantity of charge in the second shift register and in the first shift register to pass from the first-occurring to the last-occurring parallel input thereof, both said shift registers being operable with the same pulse train.

7. A transversal filter comprising analogue shift register means having successive storage positions, said shift register means having a number of parallel inputs and comprising input charge receiving storage positions having the respective parallel inputs assigned thereto, and said shift register means having a common output, a further number of individual predeterminable evaluating circuit means each having at least one signal input for the input of the signal which is to be filtered, and at least one output, each evaluating circuit means being arranged to weight the input signal thereto in accordance with an individual evaluation factor for producing at its output a weighted charge for supply to an associated input charge receiving storage position, switching element means controlling coupling of the outputs of the evaluating circuit means with the respective assigned parallel inputs for supplying the weighted charges to respective input charge receiving storage positions via the respective assigned parallel inputs, each storage position of the shift register being at least such that it is always able to accommodate the maximum quantity of charge supplied by a preceding storage position, and each input charge receiving storage position being such that it is always able to accommodate the maximum quantity of charge supplied by a preceding storage position and additionally able to accommodate the maximum quantity of charge supplied via its assigned parallel input, said filter being further characterized in that said evaluating circuit means comprises a first group of evaluating circuits for supplying a quantity of charge which, apart from an individual evaluation factor, is equal to the difference between the relevant signal value of the signal which is to be filtered minus a predetermined minimum value which is not greater than the value of the signal minimum, and a second group of evaluating circuits for supplying a quantity of charge which, apart from an individual evaluating factor, is equal to the difference between a maximum value which is at least equal to the value of the signal maximum, minus the relevant signal value.

8. A transversal filter as claimed in claim 7 characterized in that said shift register means comprises a charge coupled device wherein, on a surface of a substrate (10, 100') which is provided with at least one substrate terminal and consists of doped semiconductor material of at least one conductivity type there is arranged at least one series of capacitor elements (111 to 152 and 81 to 84), which each consist at least of one insulating layer capacitor and/or at least one blocking layer capacitor, and which, in the case of capacitor elements (111, 121, 131, 141, 151 in FIG. 2 and 82 and 84 in FIG. 8), which are intended for one and the same shift pulse train, possesses a parallel input.

9. A transversal filter as claimed in claim 8, characterized in that the charge coupled device (8) is arranged for four-phase operation which, in the case of every capacitor element (84) whose next but one neighbor is a capacitor element (82) having a parallel input, possesses an additional parallel input, wherein every additional parallel input is assigned an additional evaluating circuit (23", 24, 25), wherein the signal outputs of all the evaluating circuits (21, 22, 23', 23", 24 and 25) are connected on the one hand via a first switching element (902) and on the other hand via a second switching element (903) and a delay element (904) to a common signal input (200), where the delay element has a delay time which is equal to the time required by a quantity of charge to pass from the first capacitor element having one of the parallel inputs to the last capacitor element having one of the parallel inputs.

10. A transversal filter as claimed in claim 9, characterized in that the first and second switching elements each comprise a field effect transistor.

11. Process for the operation of a transversal filter as claimed in claim 9, characterized in that the first switching element is closed during the period of time in which the maximum pulse train voltage difference prevails across the capacitor element having a parallel input, and that the second switching element is closed during the period of time in which the maximum pulse train voltage prevails across a capacitor element having an additional parallel input, and that read-in occurs whenever a quantity of charge has been shifted to the next but one, adjacent capacitor element.

12. A transversal filter as claimed in claim 7, characterized in that each evaluating circuit means comprises a pair of capacitors which is arranged on a surface of a substrate (10) which is provided with at least one substrate terminal and comprises doped semiconductor material, and is composed of a first insulating layer—or blocking layer—capacitor (211, 221, 231, 241 and 251), which touches a zone (40) which is arranged on the surface of the substrate, is provided with a terminal contact, and is doped oppositely to the substrate, and is composed of a second insulating layer—or blocking layer—capacitor (212, 222, 232, 242 and 252), which is arranged closely beside the first, where the second insulating layer—or blocking layer—capacitor has a capacitance which is equal to the individual factor of the respective one of said evaluating circuit means, wherein either the outer electrode of the second insulating layer—or blocking layer—capacitor is connected to the signal input and the outer electrode of the first insulating layer—or blocking layer—capacitor is connected to a terminal (51) to which a fixed voltage whose value is equal to the minimum value is connected, or else the outer electrode of the first insulating layer—or blocking layer—capacitor is connected to the signal input, and the outer electrode of the second insulating layer—or blocking layer—capacitor is connected to a second terminal (52) which is connected to a second fixed voltage whose value is equal to the maximum value, and wherein the counter electrode of the second insulating layer—or blocking layer—capacitor is connected to the output of the evaluating circuit.

13. Process for the operation of a transversal filter as claimed in claim 12, characterized in that either the terminal of the first insulating layer capacitor is connected to the fixed voltage whose value is equal to the minimum value, or the second terminal of the second insulating layer—or blocking layer—capacitor is connected to the second fixed voltage whose value is equal to the maximum value, and that within the duration of the shift process required by a quantity of charge which has been read into the shift register to pass to the adjacent storage position having a parallel input, a voltage is connected which is smaller than the voltage connected to the first insulating layer—or blocking layer—capacitor during this period of time, whereas otherwise a voltage is connected which is always greater than the latter.

14. A transversal filter as claimed in claim 7, characterized in that it is integrated on a common substrate (10, 100') consisting of doped semiconductor material.

15. A transversal filter as claimed in claim 14, characterized in that a switching element means consists of a charge transfer element having at least one gate electrode (60, 901) which is connected to a third terminal (53, 911).

16. A transversal filter as claimed in claim 7, characterized in that a shift register means possesses a series input (120) for the input of fundamental charge.

17. A process for the operation of a transversal filter as claimed in claim 22, characterized in that the analogue shift register means is operated in a known manner, that the input signal is always connected to the input of every evaluating circuit means either directly or with a time delay, that an evaluating circuit means is read-into the shift register means as a result of the closure of its switching element means at least whenever a quantity of charge is shifted from the directly adjacent storage position having a parallel input, to which at least one evaluating circuit means is connected, into the associated storage position having a parallel input, and that the filtered signal is obtained from the series output.

* * * * *